United States Patent [19]

Norwood et al.

[11] Patent Number: 5,010,260
[45] Date of Patent: Apr. 23, 1991

[54] INTEGRATED CIRCUIT FURNISHING A SEGMENTED INPUT CIRCUIT

[75] Inventors: Roger D. Norwood, Sugarland; David V. Kersh, III, Houston, both of Tex.

[73] Assignee: Texas Instruments Incorporated, Dallas, Tex.

[21] Appl. No.: 537,207

[22] Filed: Jun. 11, 1990

Related U.S. Application Data

[63] Continuation of Ser. No. 455,870, Dec. 19, 1989, abandoned, which is a continuation of Ser. No. 265,069, Oct. 31, 1988, abandoned.

[51] Int. Cl.$^5$ .............. H03K 17/08; H03K 17/16; H03K 19/003; H03K 19/092
[52] U.S. Cl. .................. 307/482.1; 307/303; 307/465.1; 307/475; 307/296.3
[58] Field of Search ............ 307/475, 303, 482.1, 307/303.1, 465, 482, 475.1, 296.3, 304, 443, 446, 571

[56] References Cited

U.S. PATENT DOCUMENTS

| | | | |
|---|---|---|---|
| 4,523,106 | 6/1985 | Tanizawa et al. | 307/465.1 |
| 4,600,995 | 7/1986 | Kinoshita | 307/465.1 |
| 4,607,339 | 8/1986 | Davis | 307/465 X |
| 4,689,654 | 8/1987 | Brockmann | 307/465 X |
| 4,710,842 | 12/1987 | Suzuki et al. | 307/465.1 |
| 4,761,566 | 8/1988 | Inoue et al. | 307/475 X |
| 4,763,022 | 8/1988 | Sheldon | 307/475 |

Primary Examiner—Stanley D. Miller
Assistant Examiner—David R. Bertelson
Attorney, Agent, or Firm—Melvin Sharp; James T. Comfort; Wade James Brady

[57] ABSTRACT

An input circuit for an integrated circuit furnishes a level shifting buffer portion adjacent a respective bond pad carried at the margin of the substrate while furnishing a clocked or latched portion adjacent the internal circuit of the integrated circuit. A lead extending from the level shifting or buffer portion to the clocked or latched portion carries the external signal applied to the bond pad and level shifted by the level shifting or buffer portion. The lead is subject to the parasitic resistance and capacitance of the integrated circuit. A multiplexer can be used to select among the level shifting portions for applying a single signal to the clocked portion and the clocked or latched portion can be part of a larger latch that receives plural signals for transmission to the internal circuit at appropriate times.

16 Claims, 5 Drawing Sheets

INTEGRATED CIRCUIT FURNISHING A SEGMENTED INPUT CIRCUIT

This application is a continuation of application Ser. No. 07/455,870, filed Dec. 19, 1989 now abandoned, which is a continuation of application Ser. No. 07/265,069, filed Oct. 31, 1988 now abandoned.

BACKGROUND OF THE INVENTION

This invention relates generally to electronic circuits carried on substrates of semiconductor materials and relates specifically to an input circuit used in such integrated circuits.

Integrated circuits comprise a substrate of semiconductor material that is processed to form electronic components in the top layers of the semiconductor material and with leads extending between the electronic components for desired interconnection. Interconnection to the integrated circuit is by way of wires attached to bonding pads carried on the substrate at the margin of the substrate. Electrical leads extending from the electronic components to these bonding pads to complete the circuits. These bonding pads occur at the periphery of the substrate.

As the area of the top surface of the integrated circuit increases and as designers try to make each integrated circuit directly compatible with more than one package option, a problem arises in that bonding pads can be displaced quite far from the input circuitry where these signals are used. This can create problems relating to electrical noise immunity, signal rise and fall times, nonuniformity of timing of received input signals and added capacitance at the bond pad.

In some cases, this problem has been attempted to be corrected by extending a metal or polysilicon connection from the bonding pad to the internal circuit where the signal is used. This arrangement becomes susceptible to noise due to the length of the metal or polysilicon lines because the TTL (transistor-transistor logic) signal traveling on this connection or lead can be bounced around by capacitive coupling from the substrate which lies directly underneath this line or from any other signal line located close to this line. This can cause an input stage or buffer to misread the logic level of the TTL level signal especially since the input stage typically is a CMOS stage trying to decipher the sometimes smaller voltages of a TTL level signal.

Regarding signal speed, since the signal traveling on the extended metal or polysilicon lead is at TTL voltages, the time for this signal to propagate to the input stage and then be detected can be considerably longer than if the signal was at CMOS logic levels. This can occur for TTL levels where the switching point may be a high percentage, such as 95%, of the entire transition of the received signal due to process variations when the circuit is being fabricated that can significantly raise or lower the trigger point. Faster recognition of the change in logic level signals would occur for CMOS logic levels where the transition would be approximately only 50% of the total transition, therefore requiring only 50% of the transition time. This stands as one good reason for not running TTL level signals long distances in CMOS logic circuitry.

Another problem is nonuniformity in signal timing. Different pads become located at different positions at the peripheral margin of the chip and, in the case of addresses, the input signals from these pads must all go to approximately the same location. These differences in propagation delays due to the difference in lead lengths causes non-uniformity in the times at which the address signals reach their input circuits. This becomes an undesirable situation that can greatly affect the set up and hold times of the address signals, which ideally, should be uniform. In particular this problem occurred on a 256K NMOS dynamic RMA.

Extending the metal or polysilicon connection from the bonding pad to the input circuit adds to the parasitic capacitance of the pad. This undesirable situation slows the charging and discharging of the pad by the address signal and the propagation of that signal to the input circuit. It also adds capacitance to the load that external circuitry must drive when using the chip.

Another arrangement for avoiding these problems is to move the entire input circuit next to its related bonding pad. This overcomes some problems and causes others. If the input circuit requires several other signals to control it then all of these signals must run to this circuit which is now located next to the bond pad. This will slow these signals because of the extra parasitic resistance and capacitance caused by the extra length in the clock leads. The extension of these clock signals leads also consumes area of the substrate surface. In the case of address leads, several clock signal leads need to be extended to each of the address signal receiving bond pads.

SUMMARY OF THE INVENTION

In accordance with the invention, an integrated circuit furnishes segmented input circuit. The input circuit comprises a level shifting or buffer portion located adjacent its respective bond pad, a clocked or latched portion located adjacent the desired internal circuit and a lead extending from the level shifting or buffer portion to the clocked or latched portion. This keeps to a minimum the number of signal leads that must be run to the level shifting or buffer portion. It also produces logic levels compatible with those on the rest of the integrated circuit from the level shifting or buffer portion and transmitts those levels across the lead and into the clocked or latched portion. Furnishing the clocked or latched portion adjacent the internal circuit of the integrated circuit resolves differences of timing propagation among the different signals, such as address signals from the clocked or latched portions to the internal circuit.

DESCRIPTION OF THE PREFERRED EMBODIMENTS

Figure 1:
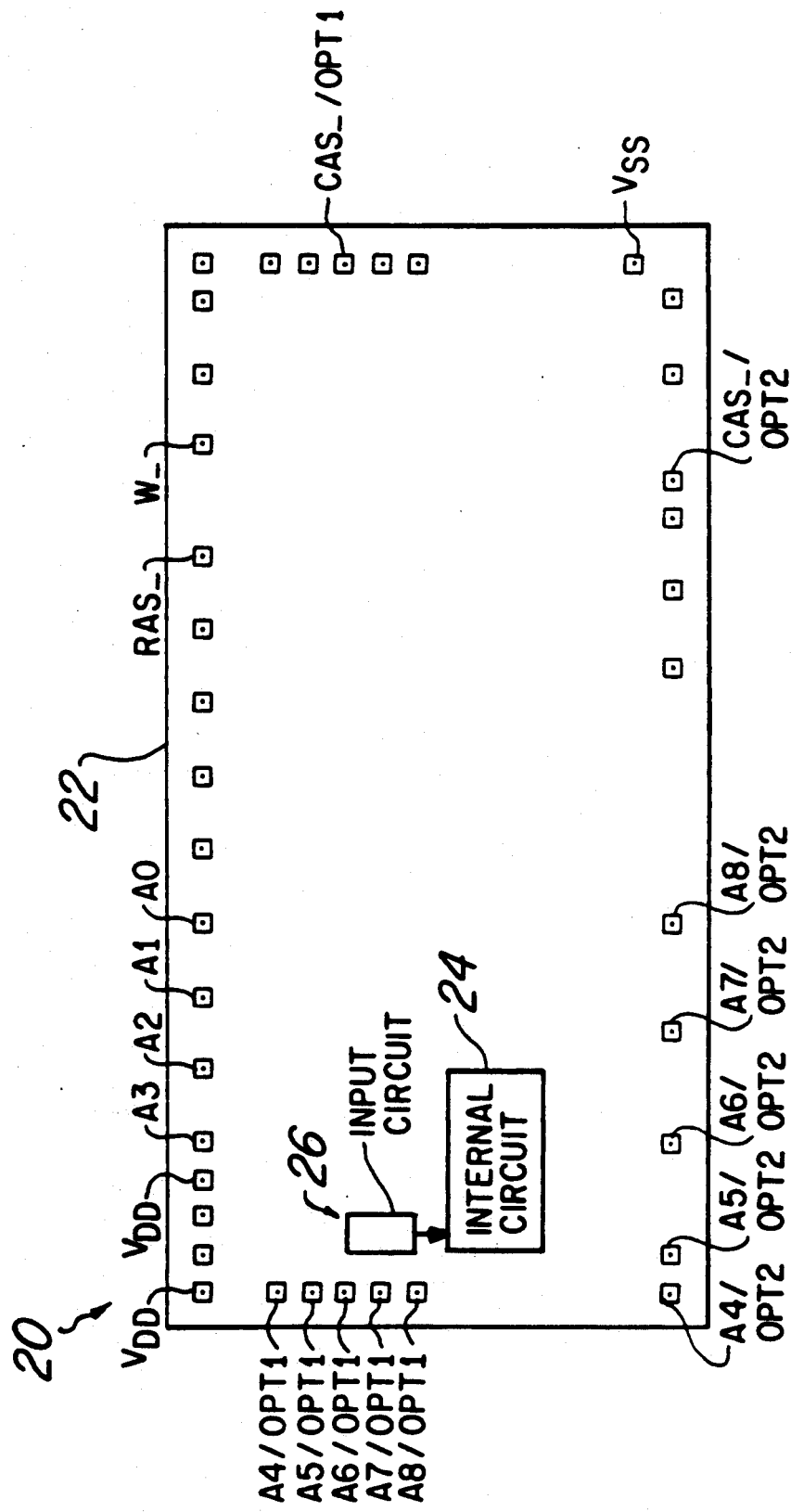
FIG. 1 is a plan view of an integrated circuit including a substrate carrying marginal bonding pads and an address latch.

In FIG. 1, integrated circuit 20 comprises a substrate 22 of semiconductor material, plural bonding pads such as A3, A6/OPT1 and A6/OPT2, and internal circuit 24. It will be understood that the substrate 22 can carry any kind or type of circuitry desired and that the internal circuit 24 stands as a representation of this internal circuitry to represent the same diagrammaticaly.

Substrate 22 further includes many bonding pads identified with various reference numerals and letters at the margins of the substrate and that many of these bonding pads are at varying distances from address latch 26. Address latch 26 also schematically represents any desired electrical circuit carried on the substrate of semiconductor material. The important feature depicted in FIG. 1 is the varying distances between the bonding pads and the internal circuit 24. For example, bonding pad A8/OPT1 is relatively close while bonding pad A0 and bonding pad A8/OPT2 are much further away from the internal circuit 24. As will be explained, all of these address leads need to pass through some type of inputs circuits from the bonding pads to the internal circuit 24. The invention overcomes problems associated with these varying distances by segmenting the input circuit in a manner to be described.

Figure 2:
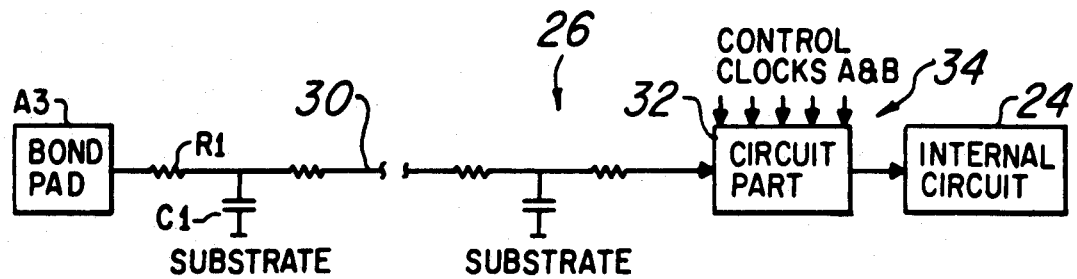
FIG. 2 is a schematic block diagram of a known input circuit.

In FIG. 2, a known input circuit 26 comprises a lead 30 and a circuit part 32 extending between bond pad A3 and internal circuit 24. Lead 30 because of its long length from bond pad A3 to circuit part 32 experiences or is subject to distributed and parasitic resistance and capacitance indicated schematically by resistors such as R1 and capacitors such as C1. Lead 30 also experiences or is subject to noise from other signals appearing near it. Control clocks A and B indicated by arrows 34 control the gating and timing of the signal received on bond pad A3 as it passes to internal circuit 24. In this situation occurs the previously discussed problems of noise susceptibility, signal speed and transmission of TTL logic levels.

Figure 3:
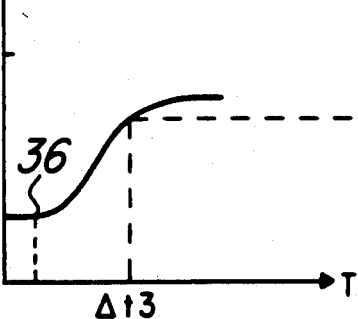
FIG. 3 is a graph of volts verses time depicting a shifted trigger point and TTL logic levels.

In FIG. 3, the TTL logic signal is indicated by curve 36 while the trigger point can occur at about 95% of that curve.

Figure 4:
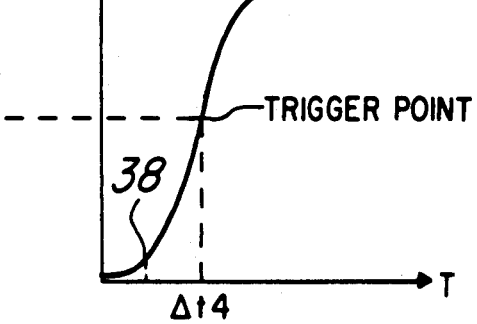
FIG. 4 is a graph of volts verses time depicting a shifted trigger point and CMOS logic levels.

In FIG. 4, curve 38 represents a CMOS logic level transition from a logic zero to a logic one. The trigger point of a logic level one occurs substantially at 50% of the transition.

The time Δt3, from the signal starting its transition to the trigger point, is substantially longer than the time in FIG. 4 Δt4, from the signal starting its transition to the trigger point. This indicates that the faster response to transitions in logic levels occurs in the CMOS logic level scheme compared with the TTL logic level scheme, in cases where the trigger point is shifted due to variances in processing the circuit.

Figure 5:
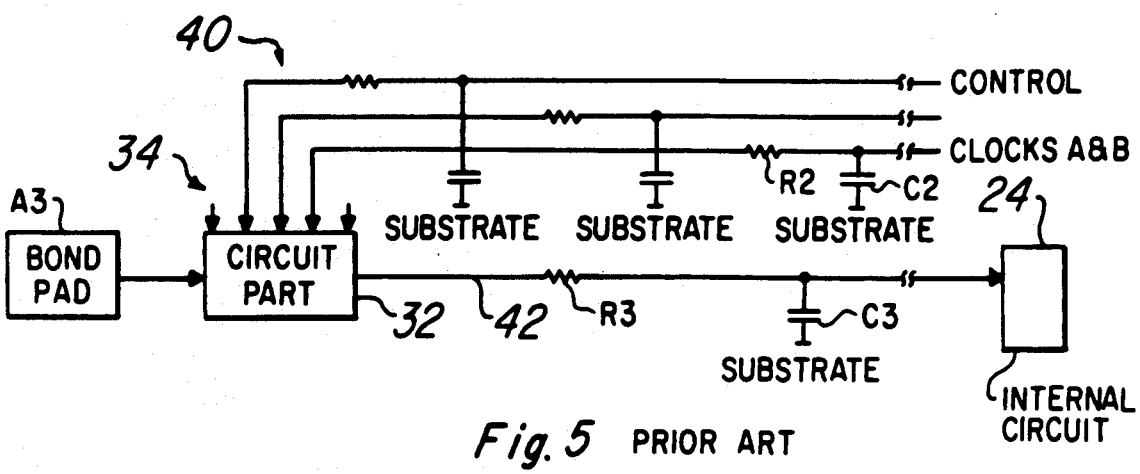
FIG. 5 is a schematic block diagram of a known input circuit.

In FIG. 5, input circuit 40 comprises circuit part 32 and lead 42 extending between bond pad A3 and internal circuit 24. In this embodiment, the circuit part 32 is adjacent bond pad A3 and the control clocks A and B represented by arrows 34 are subject to distributed parasitic capacitance and resistance indicated generally by such as resistance R2 and capacitance C2. Clocks A and B and lead 42 also are subject to noise described previously in connection with FIG. 1. Lead 42 extends from circuit part 32 to internal circuit 24 and experiences or is subject to a similar parasitic distributed resistance or capacitance represented schematically by resistance R3 and capacitance C3. This described solution to the indicated problems results in the control clocks A and B extending over large areas of the integrated circuit substrate from bond pas A0 through bond pad A8/OPT2 and can increase the chip width or length.

Figure 6:
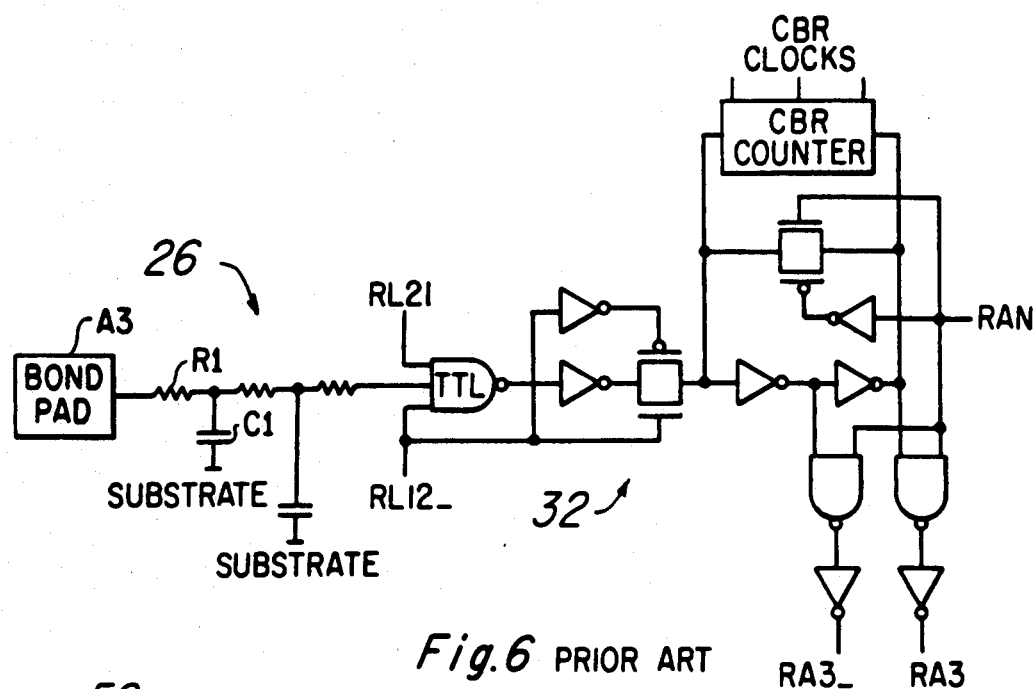
FIG. 6 is an idealized circuit diagram of the input circuit depicted in FIG. 2.

In FIG. 6, the input circuit 26 and particularly the circuit part 32 comprises a group of gates receiving signals RL21, RL12_ RAN and CBR clocks to produce the signals RA3 and RA3_. The signals RA3 and RA3_ become applied to internal circuit 24 at the desired time selected by signal RAN. They reflect the logic level of the external signal applied to bond pad A3 at a selected time. The operation of this circuit is old and should be well known.

Figures 8, 9:
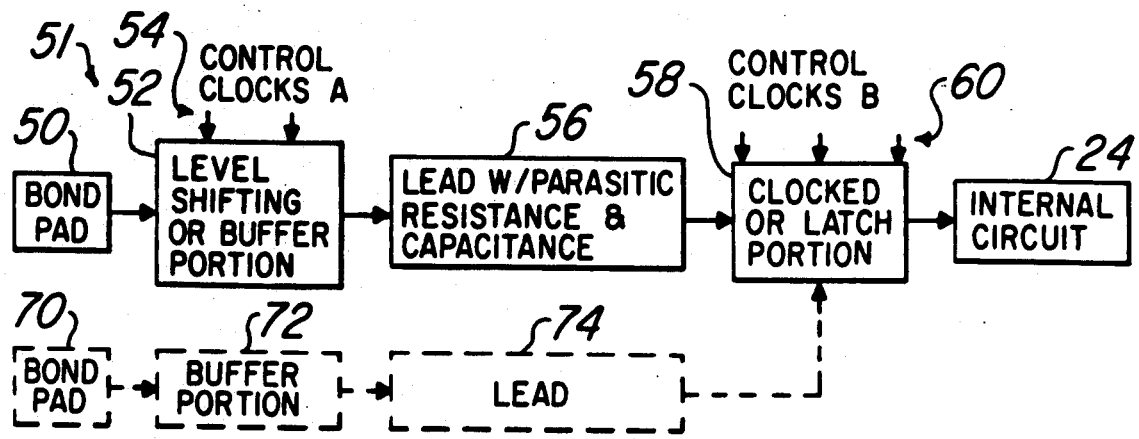
FIG. 8 is a schematic block diagram of the input circuit according to the invention.
FIG. 9 is a timing diagram of the signals appearing in the circuit of FIG. 7.

The invention recognizes or contemplates that the problems previously encountered can be reduced or minimized or overcome by segmenting the input circuit to provide a level shifting or buffer portion adjacent the bonding pad, which requires minimal numbers of control or clock leads, and placing the clocked or latched portion of the input circuit adjacent the internal circuit. FIG. 8 depicts this schematically.

An external signal applied to bond pad 50 flows a short distance to the level shifting or buffer portion 52 which also receives control clocks A, indicated by arrows 54. Level shifting or buffer portion 52 converts the TTL logic level signal received from bond pad 52 to desired logic levels such as CMOS logic levels. These CMOS logic level signal flow across lead 56 subject to any parasitic resistance and capacitance naturally occurring on the substrate of semiconductor material to a clocked or latched portion 58. Clocked or latched portion 58 receives control clocks B, indicated by arrows 60, for transmission of the received logic level at a desired time to internal circuit 24. With this arrangement a minimal number of control clocks A pass to the level shifting or buffer portion 52 located adjacent to bond pad 50 to perform level shifting of received signals; the more numerous control clocks B pass the short distance to the clocked or latched portion 58. This provides low use of the substrate surface for controlling clock leads, close timing of the address leads for presentation to the internal circuits 24 and transmission of CMOS logic level signals across lead 56 from each level shifting or buffer portion 52 to the clocked or latched portion 58. In actually, especially concerning address leads, there can be several level shifting or buffer portions, one for each address lead bond pad, with one clocked or latched portion 58 receiving more than one of the address signals. This is indicated schematically in FIG. 8 by bond pad 70, buffer portion 72 and lead 74 indicated in dashed lined outlined.

Figure 7:
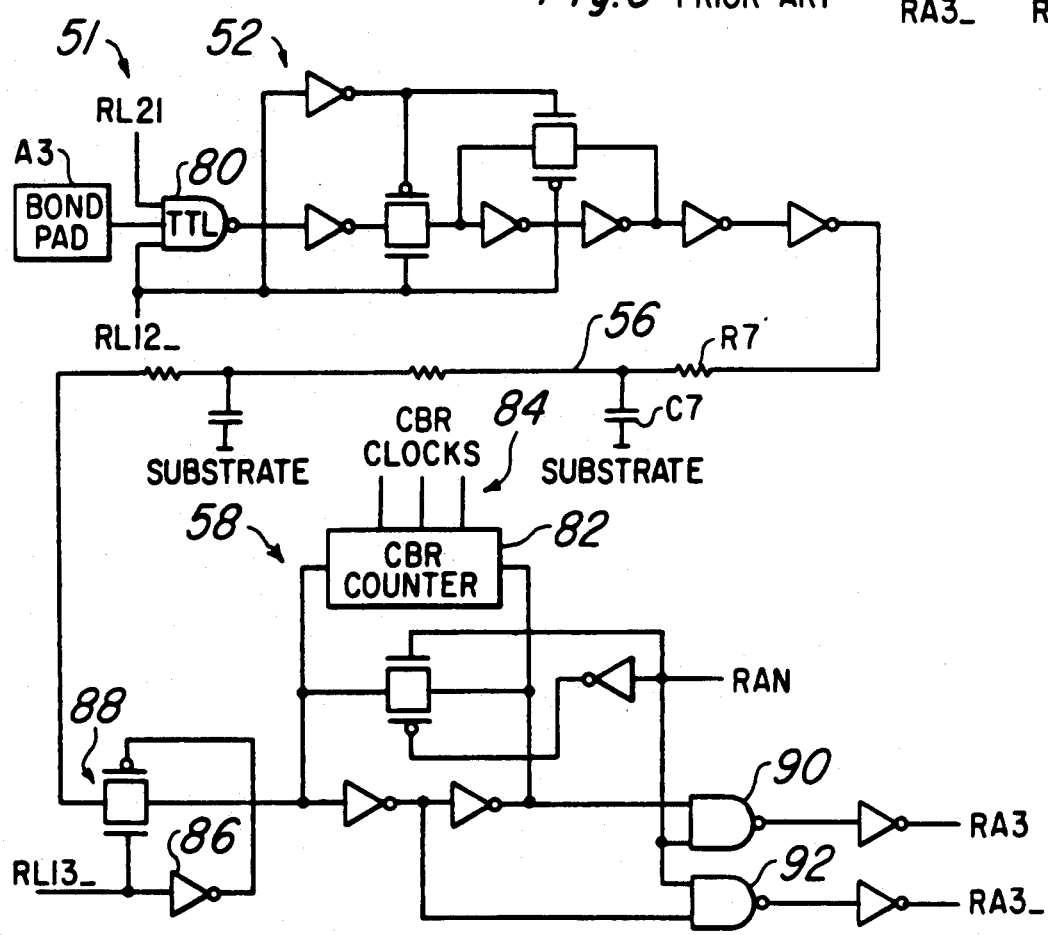
FIG. 7 is an idealized circuit diagram of an input circuit according to the invention.

In FIG. 7, level shifting or buffer portion 52 comprise TTL compatible gate 80 receiving the timing signals RL21 and RL12_ together with the external logic signal received on bond pad A3. Desired inverters and pass transistor arrangements, formed of insulated gate field effect transistors as desired, provide the desired level shifting from TTL logic levels to CMOS logic levels with any related buffering. Lead 56 experiences or is subject to distributed and parasitic resistance and capacitance indicated schematically by such as resistor R7 and capacitor C7 and the previously described noise.

Clocked or latched portion 58 comprises CBR counter 82 receiving CBR clock signals indicated by arrow 84 and also received signals RL13__ and RAN. Signal RL13__ operates through an inverter 86 and desired pass transistors 88 to accept and hold the logic level presented on bond pad A3 at the appropriate time. Signal RAN operates through NAND gates 90 and 92 at the appropriate time to produce the signals RA3 and RA3__.

FIG. 9 depicts the timing involved in operating circuit 51 of FIG. 7 with the signals RA3 and RA3__ being valid during period 94 while the signal RAN is at a logic one level. This signal RAS__ is the signal applied to the integrated circuit at the bond pad indicated in FIG. 1. The signals RA3 and RA3__ can be row addresses.

Figure 11:
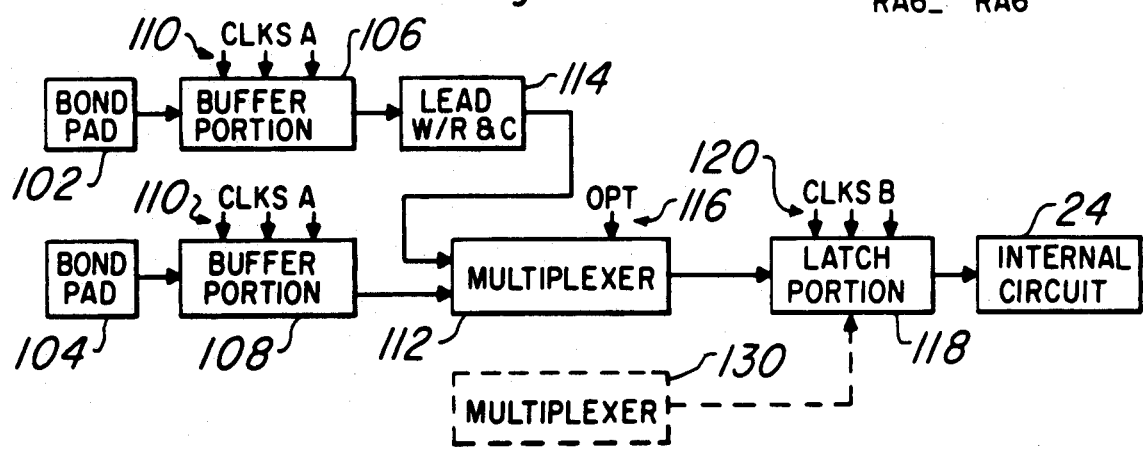
FIG. 11 is a schematic block diagram of an additional circuit according to the invention.

In FIG. 11, an input circuit 100 comprises a pair of bond pads 102 and 104 receiving an external signal applied to the integrated circuit and passing same to buffer portions 106 and 108. Buffer portions 106 and 108 each receive clocks A, indicated by arrows 110 and pass a level shifted representation of the logic signal received on pads 102 and 104 to multiplexer 112. Buffer portion 106 passes its logic level signal over a lead 114 experiencing or subject to parasitic resistance and capacitance. Multiplexer 112 selects between the two signals in response to an option signal 116 and passes the selected logic level signal to the latch portion 118 and eventually to an internal circuit 24. Latch portion 118 operates in response to clocks B indicated by arrows 120. The option signal 116 can be an electrical signal produced by internal circuit 24 or can result from a metal or polysilicon mask option.

Figure 10:
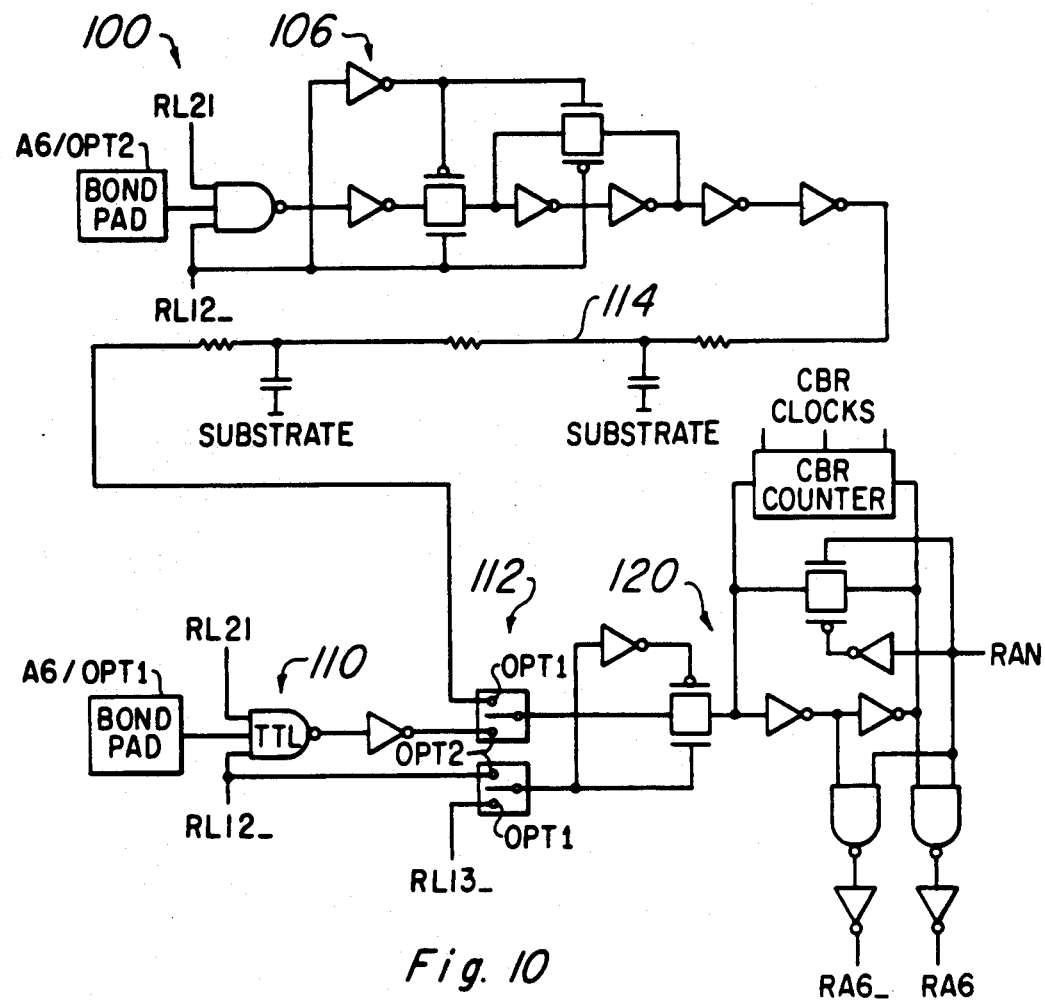
FIG. 10 is an idealized circuit diagram of an additional embodiment of the input circuit of the invention.

As depicted in FIG. 10 and also is FIG. 1, the bond pad A6/OPT2 and A6/OPT1 respectively are distal and proximate the internal circuit 24. By thus segmenting the input circuit into separate buffer and latch portions the advantages of the invention obtain while avoiding the draw backs of the previously known circuit arrangements, such as non-uniform set-up and hold times to the external user.

As is schematically indicated in dashed outline in FIG. 11, additional multiplexers 130 can transmit signals to latch portion 120, which can be part of a larger address latch that presents the address signals to the internal circuit 24.

Modifications and variations of the present invention can be obtained in light of the above teachings while remaining within the scope of the appended claims. It is therefore to be understood that within the scope of the appended claim the invention by be practiced other than as is specifically described. For example other circuit arrangements for the buffer portions, multiplexer and latch portions can be used. Different logic levels can be used other than TTL and CMOS and different numbers of signals through respective buffer portions can be applied to a large latch circuit having several separated latch portions.

We claim:

1. An integrated circuit furnishing a segmented input circuit, comprising:
   A. a substrate of semiconductor material;
   B. plural bonding pads carried upon said substrate at the margin of said substrate, at least some of said bonding pads receiving signals from external of said substrated;
   C. an internal circuit formed on said substrate and receiving at least one of said signals received at one of said bonding pads, said one bonding pad being spaced from said internal circuit a distance that otherwise includes sufficient parasitic capacitance and resistance to distort said at least one signal; and
   D. an input circuit formed on said substrate and connecting said one bonding pad to said internal circuit to carry said at least one signal from said bonding pad to said internal circuit, said input circuit including a level shifting portion located adjacent said bonding pad that changes said signal from external of said substrate to voltage levels used in said internal circuit, a lead subject to parasitic resistance and capacitance extending from said level shifting portion and carrying said level shifted signal, and a clocked portion located adjacent said internal circuit and connected to said lead to pass said signal from said lead to said internal circuit in conjunction with control clocks extending to said clocked portion.

2. The integrated circuit of claim 1 in which said level shifting portion includes circuitry receiving TTL logic levels in said signal from external of said substrate and producing CMOS level logic signals for said level shifted signal.

3. The integrated circuit of claim 1 in which said clocked portion includes a counter circuit receiving said control clocks and controlling the passing of said level shifted signal from said lead to said internal circuit.

4. The integrated circuit of claim 1 which said level shifting portion includes at least one gate receiving logic signals for gating said external signal into said level shifting portion.

5. The integrated circuit of claim 1 in which said bonding pads are distributed around the margin of the substrate, there are plural level shifting portions each located adjacent a bonding pad, there are plural clocked portions grouped adjacent said internal circuit, and there are plural leads of varying length extending from respective level shifting portions to said clocked portions.

6. The integrated circuit of claim 1 including a pair of level shifting portions, each adjacent one bonding pad and receiving an external signal from its respective bonding pad, and a multiplexer adjacent said clocked portion and receiving the level shifted signals from said pair of level shifting portions and providing one of said level shifted signals to said clocked portion.

7. The integrated circuit of claim 6 in which said lead extends from one level shifting portion to the multiplexer.

8. The integrated circuit of claim 6 in which there are plural multiplexers each transmitting a level shifted signal to said clocked portion.

9. A integrated circuit furnishing a segmented input circuit, comprising:
   A. a substrate of semiconductor material;
   B. plural bonding pads carried upon said substrate, at least some of said bonding pads receiving signals from external of said substrate;
   C. an internal circuit formed on said substrate and receiving at least one of said signals received at one of said bonding pads, said one bonding pad being spaced from said internal circuit a distance that otherwise presents sufficient parasitic capacitance and resistance to distort said at least one signal; and D. an input circuit formed on said substrate and connecting said one bonding pad to said internal circuit to carry said at least one signal from said bonding pad to said internal circuit, said input circuit including a buffer portion located adjacent said bonding pad that changes said signal from external of said substrate to a buffered signal, a lead subject to parasitic resistance and capacitance extending from said buffer portion and carrying said buffered signal, and a latch portion located adjacent said internal circuit and connected to said lead to pass said buffered signal from said lead to said internal circuit.

10. The integrated circuit of claim 9 in which said buffer portion includes circuitry receiving TTL logic levels in said signal from external of said substrate and producing CMOS level logic signals for said buffered signal.

11. The integrated circuit of claim 9 in which said latch portion includes a counter circuit receiving control clocks and controlling the passing of said buffered signal from said lead to said internal circuit.

12. The integrated circuit of claim 9 in which said buffer portion includes at least one gate receiving logic signals for gating said external signal into said buffer portion.

13. The integrated circuit of claim 9 in which said bonding pads are distributed on the substrate, there are plural buffer portions each located adjacent a bonding pad, there are plural latch portions grouped adjacent said internal circuit, and there are plural leads of varying length extending from respective buffer portions of said latch portions.

14. The integrated circuit of claim 9 including a pair of buffer portions, each adjacent one bonding pad and receiving an external signal from its respective bonding pad, and a multiplexer adjacent said latch portion and receiving the buffered signals from said pair of buffer portions and providing one of said buffered signals to said latch portion.

15. The integrated circuit of claim 14 in which said lead extends from one buffer portion to the multiplexer.

16. The integrated circuit of claim 14 in which there are plural multiplexers each transmitting a buffered signal to said latch portion.

* * * * *